(12) United States Patent
Lopp et al.

(10) Patent No.: US 9,005,414 B2
(45) Date of Patent: Apr. 14, 2015

(54) MAGNET ARRANGEMENT FOR A TARGET BACKING TUBE, TARGET BACKING TUBE INCLUDING THE SAME, CYLINDRICAL TARGET ASSEMBLY AND SPUTTERING SYSTEM

(75) Inventors: Andreas Lopp, Freigericht (DE); Juergen Grillmayer, Frankfurt (DE); Wolfgang Krock, Erlensee (DE)

(73) Assignee: Applied Materials, Inc., Santa Clara, CA (US)

( * ) Notice: Subject to any disclaimer, the term of this patent is extended or adjusted under 35 U.S.C. 154(b) by 270 days.

(21) Appl. No.: 12/840,021

(22) Filed: Jul. 20, 2010

(65) Prior Publication Data
US 2012/0012458 A1  Jan. 19, 2012

(30) Foreign Application Priority Data

Jul. 16, 2010  (EP) .................................... 10169891

(51) Int. Cl.
*H01J 37/34* (2006.01)
(52) U.S. Cl.
CPC ......... *H01J 37/3405* (2013.01); *H01J 37/3461* (2013.01); *H01J 37/345* (2013.01); *H01J 37/342* (2013.01); *H01J 37/3452* (2013.01)
(58) Field of Classification Search
CPC ............................ H01J 37/3461; H01J 37/345
USPC .............................. 204/298.2, 298.22, 298.17
See application file for complete search history.

(56) References Cited

U.S. PATENT DOCUMENTS

| | | | |
|---|---|---|---|
| 2002/0046945 A1* | 4/2002 | Hosokawa et al. | 204/298.18 |
| 2005/0034981 A1* | 2/2005 | Fuchs et al. | 204/298.21 |
| 2005/0051424 A1* | 3/2005 | Fu et al. | 204/192.15 |
| 2007/0261952 A1 | 11/2007 | Wagner | |

OTHER PUBLICATIONS

Jezek, Geno. "History of Magnets." How Magnets Work. N.p., 2006. Web. Jul. 10, 2012. <http://www.howmagnetswork.com/earths_magnetic_fields.html>.*
McGraw-Hill. "Magnetic Axis." McGraw-Hill Dictionary of Scientific and Technical Terms Sep. 26, 2002, Sixth Edition.*
Racetrack Detail (annotated drawings of Fu et al.), PGPUB US-2005/0051424-A1.*
Extended European Search Report for European Patent Application No. 10169891.8 dated Jan. 14, 2011.

* cited by examiner

*Primary Examiner* — Keith Hendricks
*Assistant Examiner* — Timon Wanga
(74) *Attorney, Agent, or Firm* — Patterson & Sheridan, LLP (57) ABSTRACT

The disclosure relates to a magnet arrangement for a sputtering system, wherein the magnet arrangement is adapted for a rotatable target of a sputtering system and includes: a first magnet element extending along a first axis; a second magnet element being disposed around the first magnet element symmetrically to a first plane; wherein the second magnet element includes at least one magnet section intersecting the first plane; and wherein a magnetic axis of the at least one magnet section is inclined with respect to a second plane being orthogonal to the first axis. Further, the disclosure relates to a target backing tube for a rotatable target of a sputtering system, a cylindrical rotatable target for a sputtering system, and a sputtering system.

21 Claims, 6 Drawing Sheets

MAGNET ARRANGEMENT FOR A TARGET BACKING TUBE, TARGET BACKING TUBE INCLUDING THE SAME, CYLINDRICAL TARGET ASSEMBLY AND SPUTTERING SYSTEM

The present disclosure relates to a magnet arrangement for rotatable target. More specifically, the present disclosure relates to a magnet arrangement for a rotatable target of a sputtering system. Further, the present disclosure relates to a target backing tube for a rotatable target of a sputtering system. Further, the present disclosure relates to a rotatable target cylinder of a sputtering system. Additionally, the present disclosure relates to a cylindrical target assembly including a target backing tube. Further, the present disclosure relates to a sputtering system including a vacuum chamber and at least one target backing tube.

BACKGROUND

In many applications, it is necessary to deposit thin layers on a substrate. The term "substrate" as used herein shall embrace both inflexible substrates, e.g., a wafer or a glass plate, and flexible substrates, for example, webs and foils. Typical techniques for depositing layers are evaporating, sputtering, and chemical vapor deposition.

Representative examples include (but are not limited to) applications involving: semiconductor and dielectric materials and devices, silicon-based wafers, flat panel displays (such as TFTs), masks and filters, energy conversion and storage (such as photovoltaic cells, fuel cells, and batteries), solid-state lighting (such as LEDs and OLEDs), magnetic and optical storage, micro-electro-mechanical systems (MEMS) and nano-electro-mechanical systems (NEMS), micro-optic and opto-elecro-mechanical systems (NEMS), micro-optic and optoelectronic devices, transparent substrates, architectural and automotive glasses, metallization systems for metal and polymer foils and packaging, and micro- and nano-molding.

In an evaporation process, the material to be deposited is heated so that it evaporates and condenses on the substrate. Sputtering is a vacuum coating process used to deposit thin films of various materials onto the surface of a substrate. For example, sputtering can be used to deposit a metal layer, such as a thin layer of aluminum, or ceramics. During the sputtering process, the coating material is transported from a target to the substrate to be coated by bombarding the surface of the target with ions of an inert gas which have been accelerated by a high voltage. When the gas ions hit the outer surface of the target, their momentum is transferred to the atoms of the material so that some of them can gain sufficient energy to overcome their bonding energy in order to escape from the target surface and to deposit on the substrate. Thereon, they form a film of the desired material. The thickness of the deposited film is, inter alia, dependent on the duration of the substrate's exposure to the sputtering process.

Typically, sputtering systems are used to coat substrates, for example, window paints, semiconductor devices, displays, and the like. Typically, plasma is formed in a vacuum chamber, in which the sputtering target is disposed. For example, rotating sputtering targets may be used. Typically, the rotating sputtering targets have a cylindrical form and rotate about their longitudinal axis. The sputtering targets are disposed on a backing tube in which magnetrons may be arranged. The magnetrons may be driven by a direct current or an alternating current. The magnetrons are used to create the plasma in the vacuum chamber.

Typically, a magnet arrangement or rotary cathode is disposed in the backing tube. The magnet arrangement includes an inner magnet element and an outer magnet element disposed around the inner magnet element. In operation of the sputtering system, the plasma is confined in a volume, for example, above a target element if the substrate to be coated is located above the target element, between the inner magnet element and the outer magnet element, where the magnetic field is mainly parallel to the target surface. Typically, this region may be called a "race track", as the plasma forms a closed loop with two straight parts along the long side of the magnet arrangement and a curve at both ends of the magnet arrangement. A typical arrangement of the magnet elements leads to an unbalanced situation at the ends, in particular in longitudinal direction, of the magnet arrangement, also called race track curves or plasma turn arounds. As there is more magnetic mass at the outer position, the plasma is shifted or displaced towards the inner magnet in dependence of the height above the cathode surface. This means that the plasma turn around has no stable position regarding the height above the magnet elements. Thicker targets will have a shorter race track and, therefore, a larger zone with redeposition at the end in longitudinal direction of the targets.

SUMMARY

In light of the above, a magnet arrangement, a target backing tube, a cylindrical target assembly, a cylindrical rotatable target, and a sputtering system are provided.

According to one aspect, a magnet arrangement for a sputtering system is provided, wherein the magnet arrangement is adapted for a target backing tube for a rotatable target of a sputtering system and includes: a first magnet element extending along a first axis, a second magnet element being disposed around the first magnet element symmetrically to a first plane, wherein the second magnet element includes at least one magnet section intersecting the first plane, and wherein a magnetic axis of the at least one magnet section is inclined with respect to a second plane being orthogonal to the first axis.

According to a further aspect, a target backing tube for a rotatable target of a sputtering system is provided, wherein the target backing tube has a longitudinal axis, wherein the target backing tube contains a magnet arrangement including, a first magnet element extending along a first axis; a second magnet element being disposed around the first magnet element symmetrically to a first plane; wherein the second magnet element includes at least one magnet section intersecting the first plane; and wherein a magnetic axis of the at least one magnet section is inclined with respect to a second plane being orthogonal to the first axis, wherein the first axis is parallel to the longitudinal axis of the backing tube.

According to another aspect, a cylindrical target assembly is provided including a target backing tube, wherein the target backing tube has a longitudinal axis, wherein the target backing tube contains a magnet arrangement including, a first magnet element extending along a first axis; a second magnet element being disposed around the first magnet element symmetrically to a first plane; wherein the second magnet element includes at least one magnet section intersecting the first plane; and wherein a magnetic axis of the at least one magnet section is inclined with respect to a second plane being orthogonal to the first axis, wherein the first axis is parallel to the longitudinal axis of the backing tube, and the cylindrical target assembly further including at least one target cylinder being disposed around the target backing tube.

According to a further aspect, a cylindrical rotatable target for a sputtering system, wherein the cylindrical rotatable target has a longitudinal axis, wherein the cylindrical rotatable target contains a magnet arrangement including a first magnet element extending along a first axis; a second magnet element being disposed around the first magnet element symmetrically to a first plane; wherein the second magnet element includes at least one magnet section intersecting the first plane; and wherein a magnetic axis of the at least one magnet section is inclined with respect to a second plane being orthogonal to the first axis, wherein the first axis is parallel to the longitudinal axis of the backing tube.

According to another aspect, a sputtering system including a vacuum chamber and at least one cylindrical rotatable target including has a longitudinal axis, wherein the cylindrical rotatable target contains a magnet arrangement including a first magnet element extending along a first axis; a second magnet element being disposed around the first magnet element symmetrically to a first plane; wherein the second magnet element includes at least one magnet section intersecting the first plane; and wherein a magnetic axis of the at least one magnet section is inclined with respect to a second plane being orthogonal to the first axis, wherein the first axis is parallel to the longitudinal axis of the backing tube, wherein the cylindrical rotatable target is disposed in the vacuum chamber.

Further aspects, advantages, and features of the present invention are apparent from the claims, the description, and the accompanying drawings.

BRIEF DESCRIPTION OF THE DRAWINGS

A full and enabling disclosure including the best mode thereof, to one of ordinary skill in the art, is set forth more particularly in the remainder of the specification, including reference to the accompanying figures wherein.

DETAILED DESCRIPTION

Reference will now be made in detail to the various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

Figure 1:
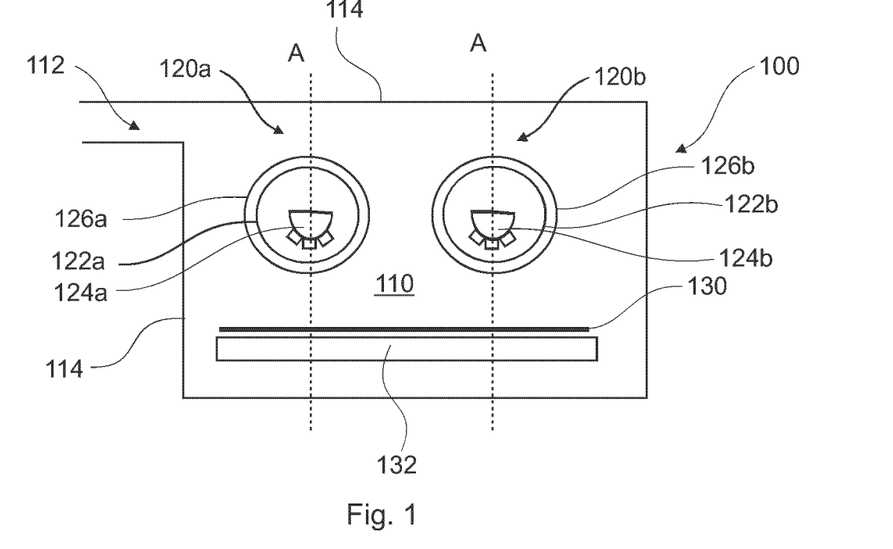
FIG. 1 shows a schematical cross-sectional view of an embodiment of a sputtering system.

Referring to the drawings, where like or similar elements are designated with identical reference numbers throughout the different figures, FIG. 1 shows a schematic cross-section of a sputtering system 100 having a vacuum chamber 110. The vacuum chamber has an inlet port 112, which may be used to provide a sputtering gas into the vacuum chamber 110, and may include an outlet (pumping) port (not shown). The vacuum chamber is limited by vacuum chamber walls 114. In typical embodiment, the sputtering system 100 includes two rotating cylindrical target assemblies 120a, 120b. The cross-section of FIG. 1 is in a plane orthogonal to the rotating axis of the cylindrical target assemblies.

In other embodiments, which may be combined with other embodiments disclosed herein, the sputtering system may include one, three, four or more cylindrical target assemblies. In a typical embodiment, which may be combined with other embodiments disclosed herein, the rotating cylindrical target assemblies 120a, 120b are driven by a drive assembly not shown in FIG. 1. The rotating cylindrical target assemblies 120a, 120b each include a backing tube 122a, 122b in which magnet arrangements 124a, 124b are disposed. Further, cylindrical target elements 126a, 126b are disposed around the backing tube 122a, 122b. For example, the cylindrical target elements 126a, 126b may be not bonded to the respective backing tube 122a, 122b. For example, the cylindrical target elements 126a, 126b may be exchanged after they have been used up. In FIG. 1, horizontal rotating cylindrical target assemblies are shown. In some embodiments, which may be combined with other embodiments disclosed herein, vertical cylindrical target assemblies may be used. In some embodiments, which may be combined with other embodiments disclosed herein, the magnet arrangement 124a, 124b may be disposed in cylindrical target elements, in particular without backing tube. Then, the cylindrical target elements are connected to a driving mechanism for rotating the cylindrical target elements around their longitudinal axis.

Further, in the vacuum chamber 110, a substrate 130 is disposed below the cylindrical target assemblies 120a, 120b. The substrate 130 may be arranged, in a typical embodiment, which may be combined with other embodiments disclosed herein, on a substrate support 132. In operation, a plasma is formed inside the vacuum chamber 110 between the cylindrical target assembly and the substrate by exciting a sputtering gas. In a typical embodiment, the sputtering gas includes argon. In further embodiments, the vacuum chamber may include substrate drive systems for driving a substrate to be coated 130 in or out of the vacuum chamber 110. For that reason, the vacuum chamber may include a vacuum lock chamber disposed in a wall of the vacuum chamber 110. In an embodiment, which may be combined with other embodiments disclosed herein, the rotating axis of the cylindrical target assemblies 120a, 120b are substantially parallel.

Typically, the magnet arrangements 124a, 124b have an elongated structure extending parallel to the longitudinal extension of the backing tube 122a, 122b in which they are disposed, for example, parallel to the longitudinal or rotating axis of the backing tubes 122a, 122b. For example, each magnet arrangement has a symmetry plane A. For example, the rotating axis of the backing tubes 122a, 122b, lies on the symmetry plane. Typically, the magnet arrangements 124a, 124b have substantially the same length as the backing tubes. For example, the magnet arrangement may have a length of about 80% or more, for example, 90% or more, of the longitudinal extension of a portion of the backing tube and/or the targets elements in the vacuum chamber 110.

Figure 2:
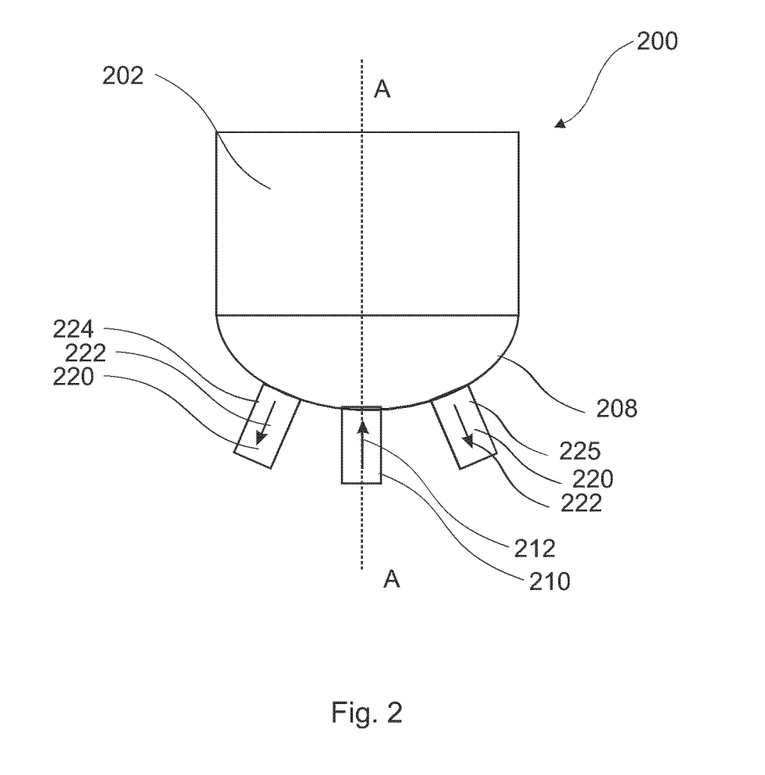
FIG. 2 shows a schematical cross-sectional view of an embodiment of a magnet arrangement.

FIG. 2 shows a cross section of an embodiment of a magnet arrangement 200 for a target backing tube. Typically, magnetrons for large area coating systems may have in embodiments a magnet arrangement as shown in FIGS. 2 to 13. The cross section is in a plane orthogonal to the symmetry plane and to a longitudinal axis of a first magnet element 210. The first magnet element 210 extends along the longitudinal or first axis of the magnet arrangement 200. Typically, the cross-section of FIG. 2 corresponds to the cross-section of FIG. 1. The magnet arrangement is symmetric to a symmetry plane A. The symmetry plane A may be also be denominated as first plane A. Typically, when mounted in the backing tube 122a, 122b, the rotating axis of the backing tube 122a, 122b lies on the symmetry plane A. The magnet arrangement 200 may include in one embodiment, which may be combined with other embodiments disclosed herein, a basic body 202 having a portion with a semi-cylindrical surface 208. In an embodiment, the basic body 202 is arranged in the backing tube of a vacuum chamber, such that the semi-cylindrical surface 208 is adapted to face the substrate to be coated 130.

In an embodiment, which may be combined with other embodiments herein, a first magnet element 210 and a second magnet element 220 are disposed on the semi-cylindrical surface 208. The first magnet element 210 extends along a first axis X which lies on the symmetry plane. In a typical embodiment, the first axis X is parallel to the rotating axis of the cylindrical target assembly shown in FIG. 1. The second magnet element 220 is disposed around the first magnet element 210. For example, the second magnet element has two magnet portions 224, 225, each extending in parallel to the first axis X.

The first and second magnet elements 210, 220 typically include a plurality of magnets which are arranged one after the other to form the first and second magnet elements 210, 220. In other embodiments, the first and second magnet elements 210, 220 may be formed by a single magnet.

Each magnet element has at each location a respective magnetic axis 212, 222. For the sake of convenience, the magnetic axes are shown in the respective magnet elements 210, 220 from the south pole to the north pole. Typically, the magnetic axes according to embodiments of the disclosure have a direction. Thus, the poles of the magnet elements 210, 220 facing the backing tube and the target elements are alternatingly disposed in a cross-section orthogonal to the first axis X. For example the north pole of the second magnet elements faces the target element and the substrate to be coated and the south pole of the first magnet element faces the target material and the substrate to be coated. Typically, the magnetic axis of second magnet element of portions 224, 225 extending in parallel to the first axis X is disposed is inclined with respect to the first plane A. Typically, the magnet axis of the first magnet element is arranged parallel to a normal of a surface to be coated of the substrate to be coated.

Figure 3:
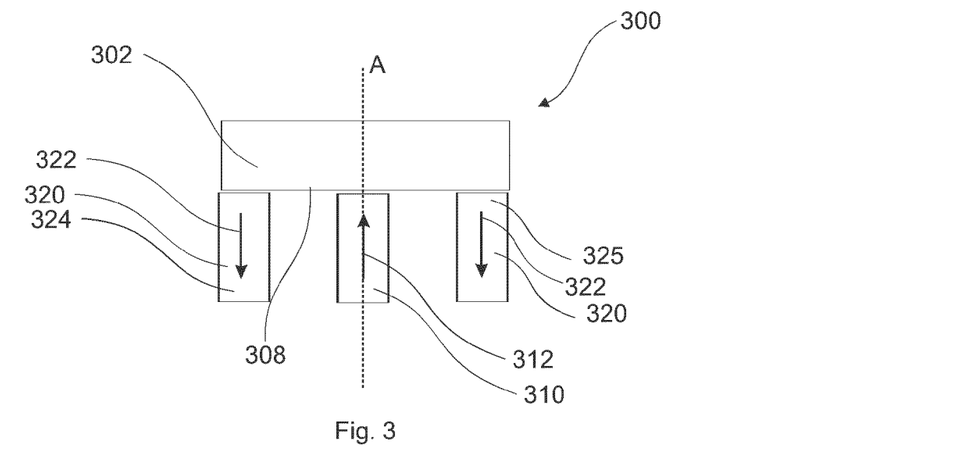
FIG. 3 shows a schematical cross-sectional view of an another embodiment of a magnet arrangement.

FIG. 3 shows a further embodiment of a magnet arrangement in a cross section orthogonal to the first plane A of the magnet arrangement and the orthogonal to the first axis X corresponding to the longitudinal axis of a first magnet element 310. The same reference numbers increased by 100 refer to the same features as in FIG. 2. The magnet arrangement 300 includes two magnet elements 310, 320, namely first magnet element 310 and a second magnet element 320 disposed on a basic body 302. The basic body has a substantially flat surface 308 to be directed to a substrate to be coated. In a typical embodiment, said surface 308 is parallel to a surface to be coated of the substrate to be coated. The magnet elements are arranged on the surface 308 of the basic body 302, such that in the cross section orthogonal to the first axis shown in FIG. 3 the magnetic axis 312 of the first magnet element 310 is anti parallel to the magnetic axis 322 of the second magnet element 320.

Figure 4:
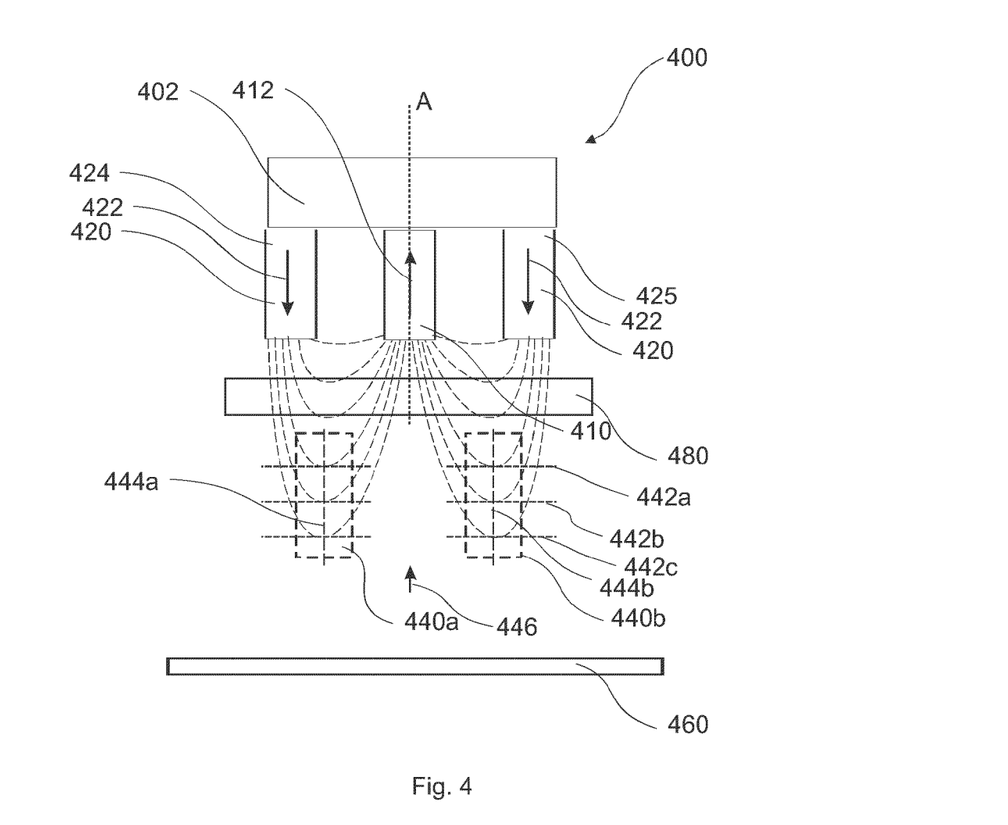
FIG. 4 shows a schematical cross-sectional view of an embodiment of a balanced magnet arrangement generating a plasma.
Figure 5:
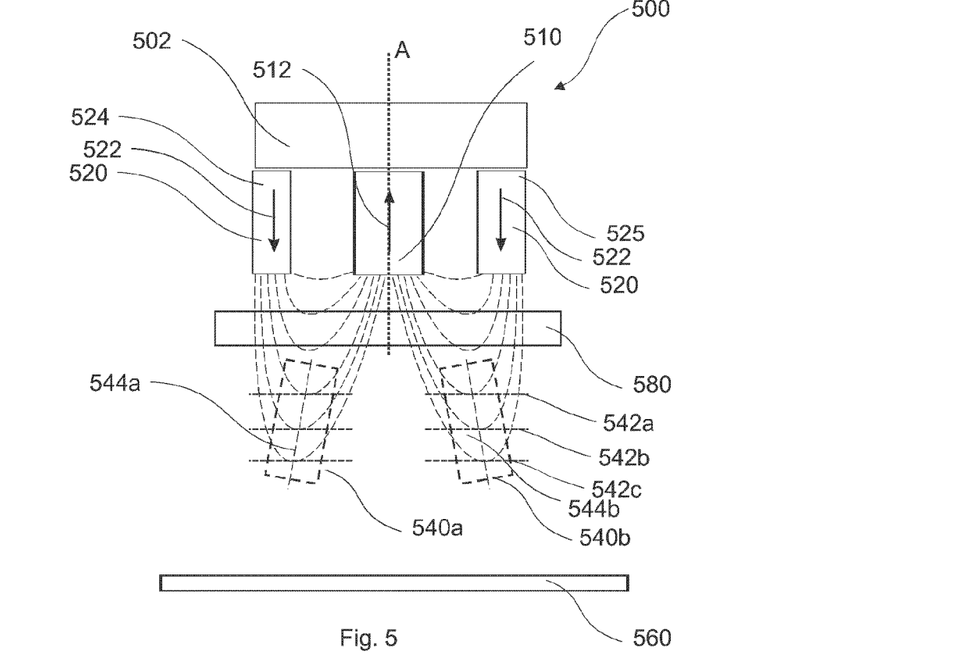
FIG. 5 shows a schematical cross-sectional view of an embodiment of an unbalanced magnet arrangement generating a plasma.
Figure 6:
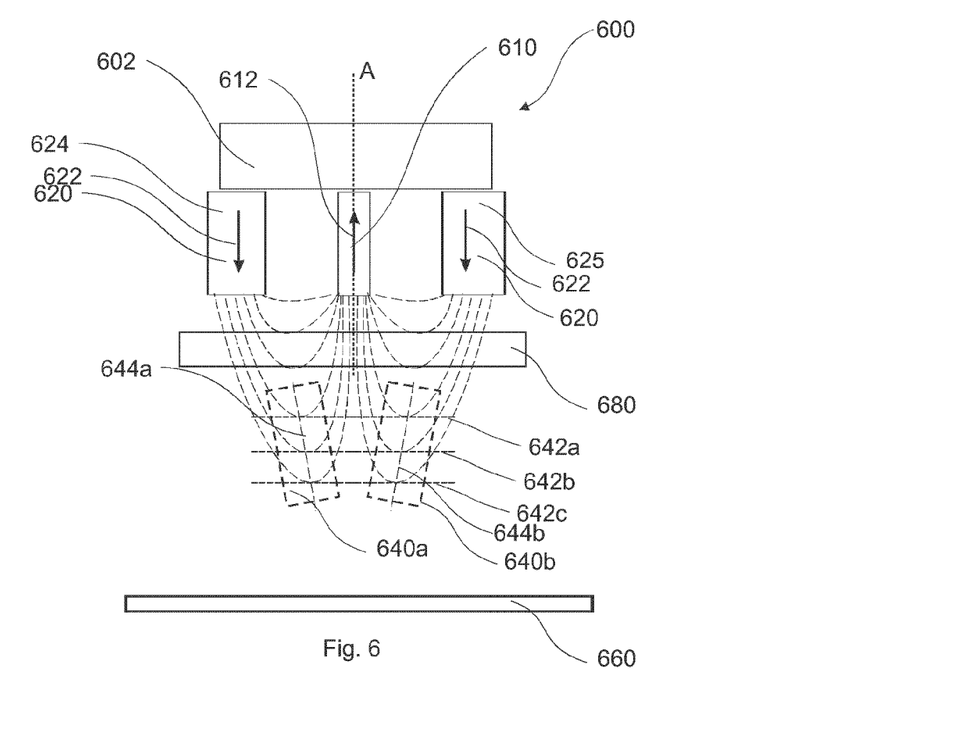
FIG. 6 shows a schematical cross-sectional view of another embodiment of an unbalanced magnet arrangement generating a plasma.

FIGS. 4, 5, and 6 are used to describe the arrangement of the plasma generated by magnet elements of a balanced and unbalanced magnet arrangements. In particular FIGS. 4, 5, and 6 shows a cross-section orthogonal to the first axis X along which a first magnet element extends.

FIG. 4 shows a magnet arrangement including two magnets similar to the magnet assembly of FIG. 3. The same features are designated with the same reference numbers increased by 100. Further, a target element 480 and a substrate 460 to be coated are shown. For the sake of simplicity, in FIGS. 4, 5, and 6 the target element is shown having a substantial planar surface. However, the target elements used in rotating target assemblies are normally substantially cylindrical.

Further, in FIG. 4, the magnetic field between the first magnet element and the second magnet element is shown. Typically, in operation of a sputtering system, a plasma is generated between the target 480 and the substrate 460 to be coated. The plasma forms, when looking onto the target 480 in direction 446, a closed loop (see also FIGS. 8 and 9). Thus, in FIG. 4, only the cross-section of the plasma 440a, 440b is shown. For the sake of simplicity, the plasma is shown in FIG. 4 with a rectangular cross section. In reality, the plasma does not have such an ideal rectangular form. The plasma has a reference curve 444a, 444b extending, in the cross-sectional view of FIG. 4, along positions, where the plasma has the highest density Typically, the plasma 440a, 440b is located between the magnet arrangement 400 and the substrate to be coated 460.

As it can be seen, the field lines of the magnet field of the first and second magnet elements 410, 420 have a tangent 442a, 442b, 442c which are substantially parallel to the surface of the target 480 facing the substrate 460 to be coated. Further, the points of the magnet fields which have the substantially parallel tangent 442a, 442b, 442c to the surface of the target element 480 are disposed on a straight line. At these positions, where the magnetic field lines have a substantially parallel tangent, the plasma has the highest density. In other words, plasma has the highest density extending along the straight lines ore reference curves 444a, 444b.

In case of balanced magnetic elements, the reference curve at which the plasma has the highest density corresponds to the straight line 444a, 444b being substantially orthogonal to the surface of the target element 480 facing the substrate 460 to be coated as shown in FIG. 4. In case of a balanced cylindrical target, the reference curves 444a, 444b are straight lines and inclined with respect to each other (not shown for the sake of simplicity), wherein each reference curve 444a, 444b being substantially orthogonal to a respective tangent of the surface of the target element, where a portion of the plasma closest to the target element is generated.

If the plasma stays focused between the inner and the outer magnet elements on the same position perpendicular to the target surface, the magnetron is called balanced.

If the outer magnet element is much stronger than the inner magnet element, the plasma will be focused more towards the inner magnets. If the inner magnet arrangement is stronger than the outer magnet element, the plasma will be focused more towards the outer regions. These two situations are typically referred to as unbalanced magnetrons. Magnetron and magnet assembly are used in this disclosure exchangeable.

FIGS. 5 and 6 show magnet elements 500 and 600 which respectively have an unbalanced magnet arrangement. The same features are designated with the same reference numbers as in FIG. 4 increased by 100 in FIG. 5 and 200 in FIG. 6.

In FIG. 5, the first magnet element 510 has a higher magnetic mass than the second magnetic element 420. Thus, the positions, where the magnetic field has a substantially parallel tangent to the target element are shifted with respect to each other, such that a reference curve connecting the points of the substantially parallel tangent of the magnetic field to the surface of the target element 580 facing the substrate to be coated has an angle to the surface of the target element 580 different to 90 degrees. In other words, the reference curves 544a, 544b, where the plasma has the highest density moves outwardly, when the distance to the target is increasing.

In other words, in case of a cylindrical target, the reference curve is not disposed on a straight line extending in radial direction through the axis of the target element and a surface portion of the target element, where a portion of the generated plasma being closest to the target element.

The reference curves 544a, 544b, 644a, 644b are shown in FIGS. 5 and 6 as a straight line. However, the reference curves 544a, 544b, 644a, 644b, where the plasma has the highest density may have also a curved or bent shape, in particular in case of unbalanced magnet arrangements. The straight line 544a, 544b connecting the points of the substantially parallel tangents of the magnetic field corresponds to points of the plasma 540a, 540b, where it has the highest density. In particular, reference curves 544a, 544b of the plasma 540a, 540b are tilted or bent with respect to the first plane A outwardly in case of planar target element or with respect to a normal of a portion of the surface of the target element, where a portion of the generated plasma being closest to the target element, the portion of the surface facing a substrate to be coated, in case of a cylindrical target element.

FIG. 6 shows an embodiment of a magnet arrangement including a second magnetic element 620 have higher magnetic mass than the first magnet element 610. Thus, the plasma 640a, 640b in operation of the sputtering assembly has a reference curve 644a, 644b, where the plasma has its highest density, which is bent or tilted inwardly with respect to a normal of a portion of the surface of the target element, where a portion of the generated plasma being closest to the target element, the portion of the surface, the portion of the surface facing the substrate 660 to be coated, in case of a cylindrical target element or with respect to the first plane A, in case of a planar target element.

In case of an unbalanced magnet arrangement and, thus, a plasma having a reference curve 644a, 644b tilted with respect to the target surface or a portion of the target element, where a portion of the generated plasma being closest to the target element, the position of the plasma with respect to the surface of the target elements 580, 680 may depend on the thickness of the target element 580, 680. This may lead to an uneven deposition or an uneven usage of the target material.

Figure 7:
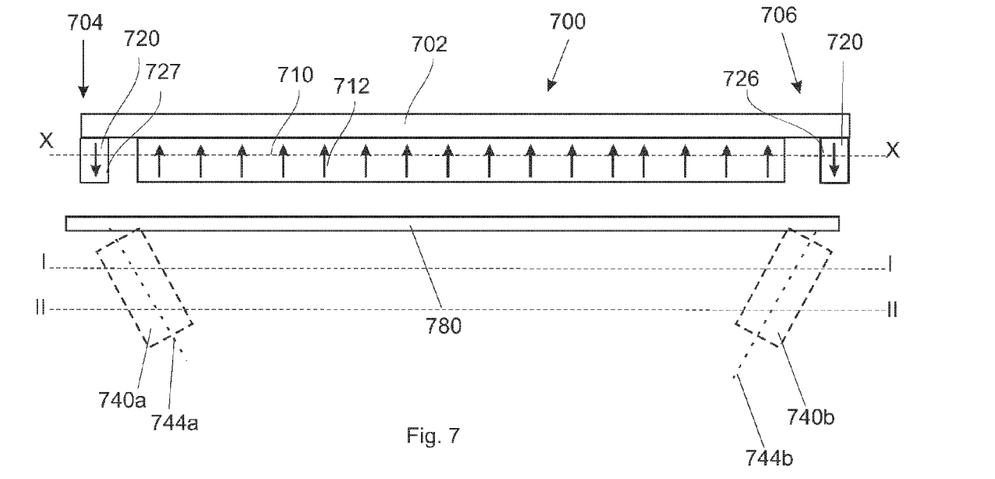
FIG. 7 shows a schematical cross-sectional view in longitudinal direction of an embodiment of an unbalanced magnet arrangement generating a plasma at the longitudinal ends of the magnet arrangement.
Figure 8:
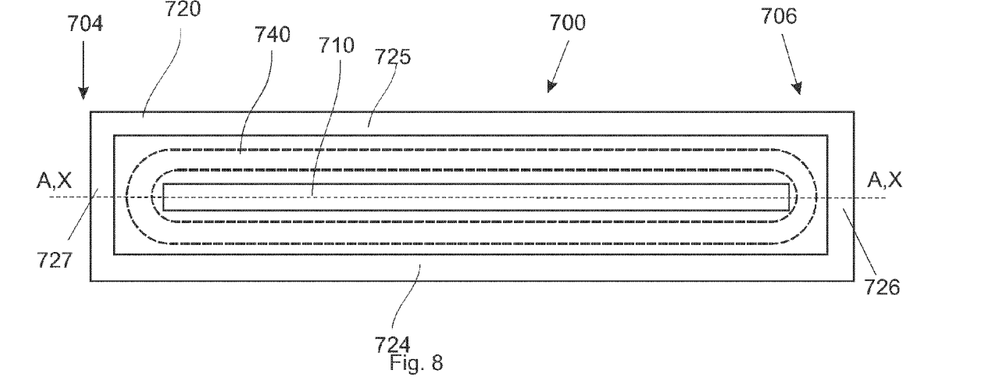
FIG. 8 shows schematically a view onto the magnet arrangement of FIG. 7 indicating the position of the plasma at a first distance I to magnet arrangement.
Figure 9:
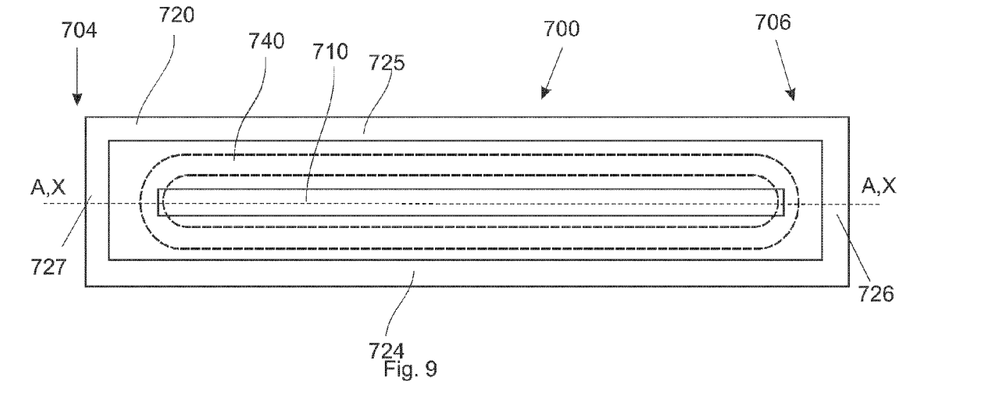
FIG. 9 shows schematically a view onto the magnet arrangement of FIG. 7 indicating the position of the plasma at a second distance II greater than the first distance I to magnet arrangement.

FIG. 8 shows a cross section along the first plane A and the first axis X of a conventional magnet arrangement 700 of a cylindrical target assembly. FIGS. 8 and 9 show, respectively, a view onto the magnet arrangement of FIG. 7, corresponding to the direction 446 of FIG. 4, indicating the position of the plasma at a first distance I to the magnet arrangement 700 (FIG. 8) and a second distance II to the magnet arrangement 700 (FIG. 9), wherein the second distance II is greater than the first distance I. The same features are indicated with the same reference number as in FIG. 4 increased by 300.

FIGS. 7, 8 and 9 show the plasma 740, 740a, 740b generated by the magnet arrangement. Further a target element 780 is shown in FIG. 7. In FIG. 7, only the position of the plasma 740a, 740b is illustrated without the field lines of the magnetic field. FIGS. 8 and 9 show that the plasma forms a ring. This is also called race track.

The magnet arrangement has a first end 704 and a second end 706 in direction of the first axis or longitudinal axis X of the magnet arrangement 700. The second magnet element 720 includes two first magnet portions being arranged substantially parallel to the first magnet element 710 and two second magnet portions 726, 727 connecting the two first magnet portions 724, 725 of the magnet element. The first and second end 704, 706 of the magnet arrangement may be also called turn around portions of the magnet arrangement or magnet assembly. The turn around portions of the magnet arrangement is unbalanced because the outer, second magnet element has much more magnetic mass in the turn around than the first, inner magnet element. In particular, the second magnet portions 726, 727 of the second magnet element have a higher magnetic mass than an end of the first magnet element 710 in direction of the first axis X. Thus, in operation the reference curves 744a, 744b of the plasma, where it has its highest density, is tilted or curved in the first plane A with respect to the surface of the target element 780. Thus, as illustrated in the FIGS. 9 and 10, in which a cross section of the plasma 740 is shown with different distance to the magnet assembly, in particular, the first distance I and the second distance II shown in FIG. 7. For example, the surface of a target element 780 directed to a substrate to be coated may be arranged at the first distance I and the second distance II.

Figure 10:
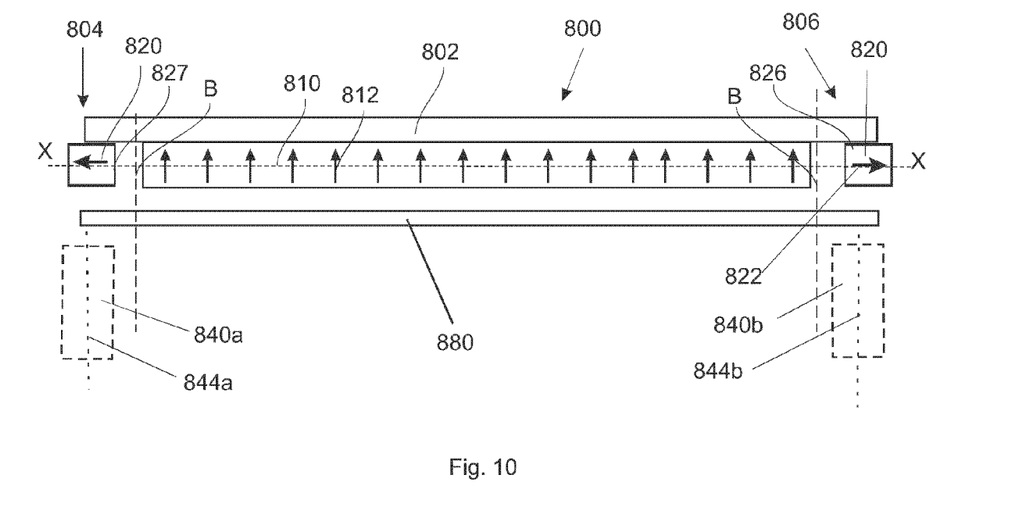
FIG. 10 shows a schematical cross-sectional view in longitudinal direction of an embodiment of a balanced magnet arrangement generating a plasma.

In FIG. 8, the plasma 740 is shown on the surface of a thin target and, in FIG. 10, the plasma 740 is shown on the surface of a thick target. As it can be seen at the first end 704 and the second end 706 in longitudinal direction of the first magnet element 710, the extension of the plasma 740 in direction of the first axis X is shorter on the surface of the thick target than of the thin target shown in FIG. 9. Thus, in case the substrate is used or worn during a deposition process, the substrate is not evenly used throughout the complete width of the rotatable target. Thus, a portion of the targets may be not used or may result in a more inhomogeneous deposition of the material of the target 780.

Figure 11:
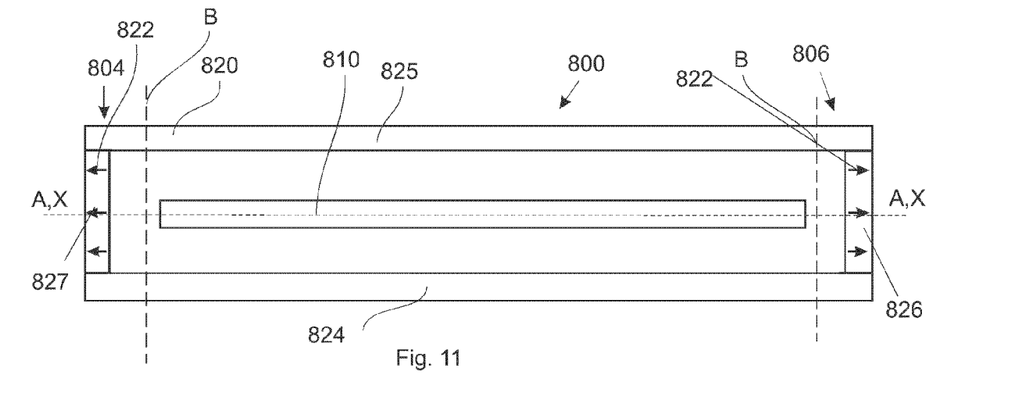
FIG. 11 shows schematically a view onto an embodiment of a balanced magnet arrangement generating a plasma.
Figure 12:
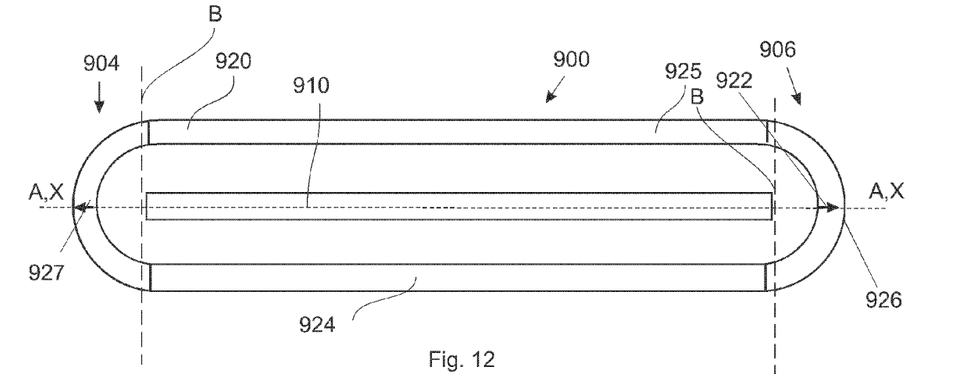
FIG. 12 shows schematically a view onto another embodiment of a balanced magnet arrangement generating a plasma.

In FIGS. 10 and 11, a magnet arrangement 800 is shown in which the same reference numbers are designated for the same features increased by 100 with respect to the embodiments shown in FIGS. 8, 9 and 10. FIG. 10 further shows a cross section of the magnet arrangement 800 in the symmetry plane A. In FIG. 12, a respective view onto the magnet element 800 from the side of the target element is shown. In a typical embodiment, the first and second magnet elements include a plurality of magnets each having substantially the same size. In other embodiments, the magnet assembly may be specifically fabricated for a first magnet element or a second magnet element.

The first magnet element 810 is arranged as in the magnet arrangement shown in FIGS. 8, 9 and 10. The second magnet element 820 has a plurality of portions, namely first magnet portions 824, 825 arranged substantially parallel to the first magnet element 810 and, respectively, a second magnet portion 826, 827 at the ends 804, 806 of the magnet arrangement in direction of the first axis X, which typically corresponds to the longitudinal axis of the first magnet element. The second magnet portions 826, 827 of the second magnet element 820 are connecting the first magnet portions 824, 825 of the second magnet element 820. Further, the first magnet portions 824, 825 are symmetrically arranged with respect to the first plane A. The second magnet portions 826, 827 are disposed on the first plane and the first axis X. As it can be seen in FIG. 10, the second magnet portions 826, 827 have a magnetic axis 822 which is tilted outwardly by an angle of 90° with respect to a second plane B orthogonal to the first axis X and/or with respect to the first magnet element. Further, the magnetic axis 822 are tilted by 90° outwardly with respect to the magnetic axis of the first magnet portions 824, 825 of the second magnet element 820. In other embodiments, the tilting angle of the magnetic axis 822 of the second magnet portion 826, 827 of the second magnet element 820 lying on the first axis X may be greater than 45 degrees, in particular greater than 60 degrees, for example, greater than 90 degrees with respect to the second plane B orthogonal to the first axis and/or the magnetic axis of the first magnet portions 824, 825 of the second magnet element 820 extending in parallel to the first magnet element. In any case, the angle with respect to the second plane B orthogonal to the first axis X and/or the magnetic axis of the second magnet element at the first magnet portions 824, 825 is selected to provide a balanced magnet arrangement and the first end 804 and the second end 806 of the magnet arrangement in direction of the first axis X. In other embodiments not the complete second magnet portions have a tilted magnet axis with respect to the second plane B orthogonal to the first axis, but a section of the second magnet element 820 included in the second magnet portions 826, 827.

Thus, the magnet arrangement according to FIGS. 10 and 11 is balanced at the first end and the second end 804, 806 such that the reference curves 844a, 844b of the plasma, where it has its highest density, is in operation of the magnet arrangement 800 substantially normal to the surface of a target element 880 facing a substrate to be coated and/or orthogonal the first axis X in the first plane A. Thus, a balanced magnet arrangement is provided by tilting the second magnet portions 826, 827 at the ends of the magnet arrangement 804, 806, in particular outwardly with respect to the magnetic axis of the second magnet element 820 at the first magnet portions 824, 825. The plasma stays in operation of the sputtering apparatus at the same position perpendicular to the target surface for different target thicknesses or different distances to the magnet arrangement. Typically, in rotating target assemblies the first plane traverses the rotating axis.

In typical embodiments, which may be combined with other embodiments disclosed herein, the same magnets may be used for the first magnet element and the second magnet element.

Embodiments disclose magnet arrangements for sputter magnetrons with tilted magnets at the plasma turn around positions. The advantage is that the plasma has the same race track curve positions for different target thicknesses. This is applicable for rotary magnetrons, as well as for planar magnetrons. A further advantage is that the plasma is located on the top of the end magnet and not between the end magnet and the inner magnet in a section in the symmetry plane. This brings the advantage that, for the same length of magnet assemblies, the plasma covers more target surface in case of a tilted end magnet or second magnet portions 826, 827, or a section of the second magnet element on the first axis.

For example, the magnetic axis of the magnet section being arranged on the symmetry plane at the first end 804 and the second end 806 of the magnet arrangement may have an inclination angle greater than about 45° and, particularly, greater than 60°, for example, greater than 80°, with respect to a plane being orthogonal to the longitudinal axis of the magnet arrangement.

Figure 13:
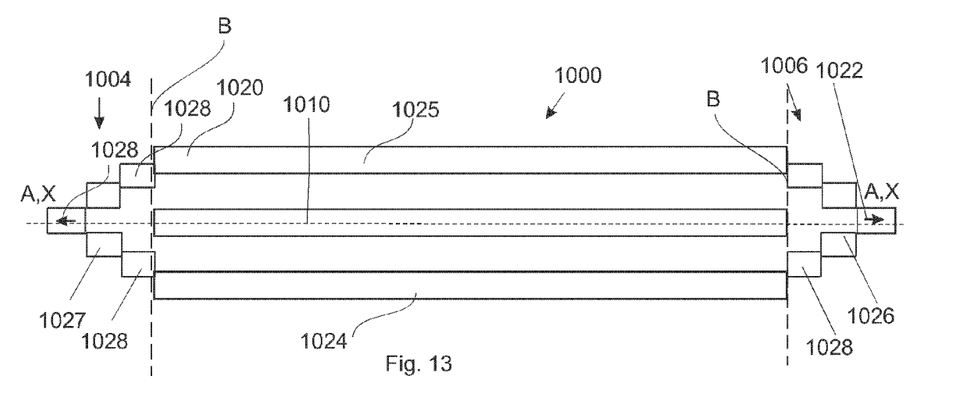
FIG. 13 shows schematically a view onto a further embodiment of a balanced magnet arrangement generating a plasma.

FIG. 12 and FIG. 13 shows respectively different turn around portions or second magnet portions 926, 927, 1026, 1027 of a magnet arrangement 900 in FIG. 12, and 1000 in FIG. 13. Each magnet arrangement 900, 1000 includes a first magnet element 910, 1010 extending along a first axis X lying on a symmetry plane A of the magnet arrangement 900, 1000. A second magnet element 920, 1020 is arranged around the first magnet element 910, 1010. The same reference numbers are used as in the drawings of FIGS. 10 and 11 with respect to the same features increased by 100 in FIG. 12 and 200 in FIG. 13.

In FIG. 12, the turn around portion or the second magnet portions 926, 927 of the second magnet element 920 has a half circular or half oval shape in a view onto the magnet arrangement, i.e. in a direction orthogonal to the first axis in the first plane. The magnetic axis of the second magnet portions 926, 927 of the second magnet element 920 are tilted as in the previous embodiment shown in FIGS. 11 and 12. In other embodiments only each second magnet portion 926, 927 include a section, in particular lying on the first axis X and/or the first plane A, which has a magnetic axis being tilted with respect to the a plane being orthogonal to the first axis and/or to the magnetic axis of the first magnet portions 924, 925 of the second magnet element 920.

In FIG. 13, the second magnet portions 1026, 1027 of the second magnet element 1020 include respectively a plurality of single magnets 1028 at the first and second end 1004, 1006 of the magnet arrangement 1000. For example, as shown in FIG. 13, the second magnet portions 1026, 1027 are respectively composed of 5 single magnets 1028. In other embodiments, the second magnet portions are composed of more than five single magnets 1028, for example seven, nine or more single magnets. 1028. In typical embodiments, the number of single magnets 1028 is uneven. Typically, to form the turn-around portion of the second magnet element 820, the single magnets 1028 are arranged such that the second magnet portions 1026, 1027 are substantially V-shaped in a view in a direction orthogonal to the first axis in the first plane.

In a typical embodiment, the outermost of the single magnets 1028 or the single magnets 1028 at the extremities in direction of the first axis X of the second magnet portion 1026, 1027 is disposed on the first axis X. The magnetic axis of the outermost magnet 1028 is tilted with respect to a plane orthogonal to the first axis X to provide a balanced magnet arrangement at the first end 1004 and a second end 1006 of the magnet arrangement 1000. In other embodiments, the magnetic axis of the other magnets of the second magnet portions 1026, 1027 may be tilted with respect to the second plane B being orthogonal to the first axis and/or with respect to the magnetic axis of the first magnet portions 1024, 1025 of the second magnet element 1020. In an embodiment, the tilting of each single magnet 1028 may be different with respect to the second plane B orthogonal to the longitudinal axis X and/or the magnetic axis of the first magnet portions 1024, 1025 of the second magnet elements 1020.

In a typical embodiment, the normal of the surface of a substrate to be coated is parallel to the first plane A.

Typically, the second element may have in embodiments small interstices, however these interstices have a shape such that the plasma forms a continuous race track.

The first magnet element extending along a first axis has a longer extension in direction of the first axis than in a direction transversal to the first axis, for example orthogonal to the first axis. For example the extension in direction of the first axis may be more than 0.5 m, for example more than 2 m, in particular more than 3.5 m. Typically, the first axis is the longitudinal axis of the first magnet element.

Typically, the second magnet element forms a ring around the first magnet element. For example in a view onto the magnet element the second magnet element surrounds the first magnet element. For example the view onto the magnet element may be a view in direction of a straight line being orthogonal to the first axis and lying in the first plane.

Typically, the magnet arrangement is balanced, in particular at least at one of the ends of the first magnet element in direction of the first axis. According to embodiments disclosed herein, the zone of redeposition in direction of the first axis is substantially the same for target elements having a different thickness. Hence, the target material is better used during a sputtering process.

In an embodiment, the second magnet element has two first magnet portions extending in parallel to the first axis. In an embodiment, the straight line in which magnetic axis of these first magnet portions are disposed may be inclined with respect to the first plane. For example, the first and second magnet element may be arranged on a semi-circular or semi-oval surface.

In an embodiment, the magnetic axis of the magnet section has an inclination angle greater than about 45 degrees, in particular greater than 60 degrees, for example, greater than 80 degrees, with respect to the second plane.

According to a further embodiment, which may be combined with other embodiments disclosed herein, the magnetic axis of the magnet section is tilted away from the first magnet element, in particular to provide a substantially balanced magnet arrangement.

In a typical embodiment, the first axis lies in the first plane.

For example, in an embodiment, the magnetic axis of the magnet section has an inclination angle of greater than about 45 degrees, in particular greater than 60 degrees, for example greater than 80 degrees, with respect to the magnetic axis of a first magnet portion of the second magnet element being arranged or extending substantially in parallel to the first magnet element, in particular to the first axis. In particular the magnet axis of the magnet section is tilted in an outward direction, away from the first magnet portion of the second element being arranged or extending substantially in parallel to the first magnet element.

According to an embodiment, which may be combined with other embodiments disclosed herein, the magnet section extends symmetrically on both sides of the first plane.

For example, in an embodiment, the form of the magnet section selected of the group consisting of a substantially U-shape, a substantially V-shaped, a half-circle, an arc of a circle, and a bar.

In an embodiment, the magnet section corresponds to at least 30 percent, in particular, at least 50 percent, of the extension of the second magnet element in a direction orthogonal to the first axis and orthogonal to the magnetic axis of the first magnetic element, for example in a direction of a normal of the first plane.

For example, in an embodiment, which may be combined with other embodiments, the first magnet element has, in the direction of the first axis, a first end and a second end opposite to the first end; wherein the at least one magnet section connects the first magnet portions of the second magnet element extending in parallel to the first axis at the first end and/or the second end of the first magnet element.

In some embodiments, the first magnet element has, in the direction of the first axis, a first end and a second end opposite to the first end, the second magnet element includes first magnet portions extending in parallel to the first axis and second magnet portions connecting the first magnet portions at the first end and/or the second end, wherein the second magnet portions include the magnet sections.

In an embodiment, the second magnet element includes two magnet sections.

According to a further aspect, a target backing tube for a rotatable target of a sputtering system is provided, wherein the target backing tube has a longitudinal axis, wherein the target backing tube contains a magnet arrangement according to one of the embodiments disclosed herein, wherein the first axis is parallel to the longitudinal axis of the backing tube.

In a typical embodiment, the longitudinal extension, in particular in the direction of the first axis, of the target backing tube in a vacuum chamber into which the target backing tube is adapted to be disposed corresponds substantially to the longitudinal extension of the first and/or second magnet element.

For example, in an embodiment, at least one target cylinder is disposed around the target backing tube.

According to a further aspect, a cylindrical rotatable target for a sputtering system is provided, wherein the cylindrical rotatable target has a longitudinal axis, wherein the cylindrical rotatable target contains a magnet arrangement according to one of the preceding claims, wherein the first axis is parallel to the longitudinal axis of the backing tube.

According to a further aspect, a sputtering system is provided including a vacuum chamber and at least one cylindrical rotatable target according to an embodiment disclosed herein, wherein the cylindrical rotatable target is disposed in the vacuum chamber.

This written description uses examples to disclose the invention, including the best mode, and also to enable any person skilled in the art to practice the described subject-matter, including making and using any devices or systems and performing any incorporated methods. While various specific embodiments have been disclosed in the foregoing, those skilled in the art will recognize that the spirit and scope of the claims allow for equally effective modifications. Especially, mutually non-exclusive features of the embodiments described above may be combined with each other. The patentable scope is defined by the claims, and may include such modifications and other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A magnet arrangement for a sputtering system having a rotatable target, wherein the magnet arrangement comprises:
   a first magnet element extending along a first axis, wherein the first magnet element has, in the direction of the first axis, a first end and a second end opposite to the first end;
   two second magnet elements, each second magnet element extending in parallel to the first axis and being symmetrically arranged on opposite sides to the first axis, wherein each second magnet element has a first end and second end;

wherein the first end of each second magnet element is arranged on a side of the first end of the first magnet element; and wherein the second end of each second magnet element is arranged on a side of the second end of the first magnet element;

a third magnet element connecting the first ends of the two second magnet elements; and a fourth magnet element connecting the second ends of the two second magnet elements, such that the second magnet elements, the third magnet element, and the fourth magnet element surround the first magnet element;

wherein a magnetic axis of the third magnet element is inclined with respect to a first plane being orthogonal to the first axis; and wherein either:

the magnetic axis of the two second magnet elements are anti-parallel to the magnetic axis of the first magnetic element within the rotatable target; or the magnetic axis of the two second magnet elements are perpendicular to the surface of the rotatable target.

2. The magnet arrangement according to claim 1, wherein the magnetic axis of the third magnet element has an inclination angle greater than about 80 degrees with respect to the first plane.

3. The magnet arrangement according to claim 1, wherein magnetic axis of the third magnet element is tilted away from the first magnet element.

4. The magnet arrangement according to claim 1, wherein the first axis lies in a second plane, wherein the second plane is perpendicular to the first plane.

5. The magnet arrangement according to claim 1, wherein the magnetic axis of the third magnet element has an inclination angle of greater than about 60 degrees with respect to a magnetic axis of the two second magnet elements extending in parallel to the first axis of the first magnet element.

6. The magnet arrangement according to claim 1, wherein the magnetic axis of the third magnet element has an inclination angle of greater than about 80 degrees with respect to a magnetic axis of the two second magnet elements extending in parallel to the first axis of the first magnet element.

7. The magnet arrangement according to claim 4, wherein the third magnet element extends symmetrically on both sides of the second plane.

8. The magnet arrangement according to claim 1, wherein the form of the third magnet element is selected from the group consisting of a substantially U-shape, a half-circle, an arc of a circle, and a bar.

9. The magnet arrangement according claim 1, wherein the third magnet element corresponds to at least 30 percent of an extension of the two second magnet elements in a direction orthogonal to the first axis and orthogonal to a magnetic axis of the first magnetic element.

10. The magnet arrangement according claim 1, wherein the third magnet element corresponds to at least 50 percent of an extension of the two second magnet elements in a direction orthogonal to the first axis and orthogonal to a magnetic axis of the first magnetic element.

11. The magnet arrangement according to claim 1, wherein a magnetic axis of the fourth magnet element is inclined with respect to the first plane being orthogonal to the first axis.

12. The magnet arrangement according to claim 1, further comprising:

a target backing tube having a longitudinal axis, wherein the target backing tube contains the magnet arrangement wherein the first axis is parallel to the longitudinal axis of the backing tube.

13. The magnet arrangement according to claim 11, wherein the magnetic axis of the fourth magnet element has an inclination angle greater than about 45 degrees with respect to the first plane being orthogonal to the first axis.

14. The magnet arrangement according to claim 11, wherein the magnetic axis of the fourth magnet element is tilted away from the first magnet element.

15. The magnet arrangement according to claim 4, wherein a magnetic axis of the fourth magnet element is inclined with respect to the first plane being orthogonal to the first axis.

16. The magnet arrangement according to claim 11, wherein the magnetic axis of the fourth magnet element has an inclination angle of greater than about 45 degrees with respect to the magnetic axis of second magnet element extending in parallel to the first magnet element.

17. The magnet arrangement according to claim 1, further comprising:

a target backing tube, wherein the target backing tube has a longitudinal axis, wherein the target backing tube contains a magnet arrangement and the magnet arrangement is cylindrical, wherein the first axis is parallel to the longitudinal axis of the target backing tube, and further comprising at least one target cylinder being disposed around the target backing tube.

18. A cylindrical rotatable target for a sputtering system, wherein the cylindrical rotatable target has a longitudinal axis, wherein the cylindrical rotatable target contains a magnet arrangement according to claim 1, wherein the first axis is parallel to the longitudinal axis of the cylindrical rotatable target.

19. A sputtering system comprising:

a vacuum chamber and at least one cylindrical rotatable target including a longitudinal axis, wherein the cylindrical rotatable target contains a magnet arrangement according to claim 1, wherein the first axis is parallel to the longitudinal axis of the cylindrical rotatable target, wherein the cylindrical rotatable target is disposed in the vacuum chamber.

20. The magnet arrangement according to claim 1, wherein the magnetic axis of the third magnet element has an inclination angle greater than about 45 degrees with respect to the first plane being orthogonal to the first axis.

21. The magnet arrangement according to claim 1, wherein the magnetic axis of the third magnet element has an inclination angle greater than about 60 degrees with respect to the first plane.

* * * * *